United States Patent [19]

Kyser et al.

[11] 4,339,763
[45] Jul. 13, 1982

[54] APPARATUS FOR RECORDING WITH WRITING FLUIDS AND DROP PROJECTION MEANS THEREFOR

[75] Inventors: Edmond L. Kyser; Stephan B. Sears, both of Portola Valley, Calif.

[73] Assignee: System Industries, Inc., Milpitas, Calif.

[21] Appl. No.: 210,799

[22] Filed: Nov. 26, 1980

Related U.S. Application Data

[63] Continuation of Ser. No. 815,502, Jul. 14, 1977, abandoned, which is a continuation-in-part of Ser. No. 489,985, Jul. 19, 1974, Pat. No. 4,189,734, which is a continuation-in-part of Ser. No. 50,445, Jun. 29, 1970, Pat. No. 3,946,398.

[51] Int. Cl.³ .................................................. G01D 15/16
[52] U.S. Cl. ............................... 346/140 R; 310/330; 310/322
[58] Field of Search ............. 346/140 R, 75; 417/322; 310/330-332

[56] References Cited

U.S. PATENT DOCUMENTS

| | | | |
|---|---|---|---|
| 2,512,743 | 6/1950 | Hansell | 346/140 R X |
| 2,614,901 | 10/1952 | Jacob | 346/75 |
| 3,107,630 | 10/1963 | Johnson | 417/322 |
| 3,108,673 | 10/1963 | Green | 400/121 |
| 3,151,543 | 10/1964 | Preisinger | 417/322 |
| 3,286,029 | 11/1966 | Simshauser | 417/322 |
| 3,373,438 | 3/1968 | Hochberg | 346/75 |
| 3,452,360 | 6/1969 | Williamson | 346/140 R |
| 3,495,604 | 2/1970 | Trask | 137/15 |
| 3,654,947 | 4/1972 | Hatch | 137/833 |
| 3,683,212 | 8/1972 | Zoltan | 346/140 R X |
| 3,708,798 | 1/1973 | Hildenbrand | 346/140 R |
| 3,747,120 | 7/1973 | Stemme | 346/140 R X |
| 3,832,579 | 8/1974 | Arndt | 346/140 R X |
| 3,852,773 | 12/1974 | Sicking | 346/140 R X |
| 3,946,398 | 3/1976 | Kyser | 346/140 R X |
| 3,988,745 | 10/1976 | Sultan | 346/140 R |
| 4,189,734 | 2/1980 | Kyser | 346/140 R X |

FOREIGN PATENT DOCUMENTS 364385  2/1974  Sweden .

OTHER PUBLICATIONS

Lee et al.; Higa—Speed Droplet Generator; IBM TDB, Vol. 15, No. 3, Aug. 1972, p. 909.

*Primary Examiner*—Joseph W. Hartary
*Attorney, Agent, or Firm*—Limbach, Limbach & Sutton

[57] ABSTRACT

A recording apparatus and method is disclosed which includes a writing fluid source feeding a drop projection means which ejects a series of droplets of writing fluid from a nozzle in a discontinuous stream with sufficient velocity to traverse a substantially straight trajectory to a recording medium. The volume of each droplet is individually controlled by electrical pulses applied to the projection means from an electronic driver. A plurality of such projection means may be employed and connected to control means whereby to print or form predetermined graphical intelligence patterns on a recording medium.

4 Claims, 10 Drawing Figures

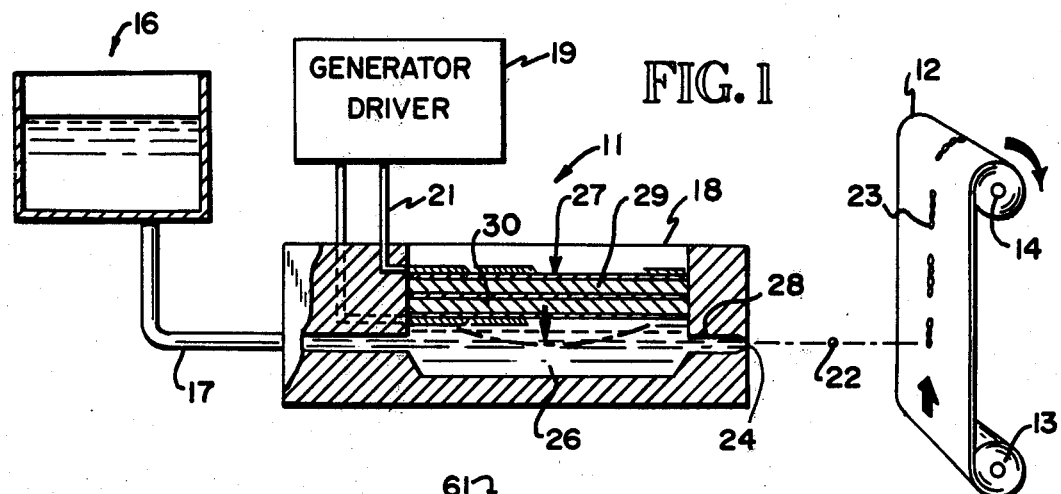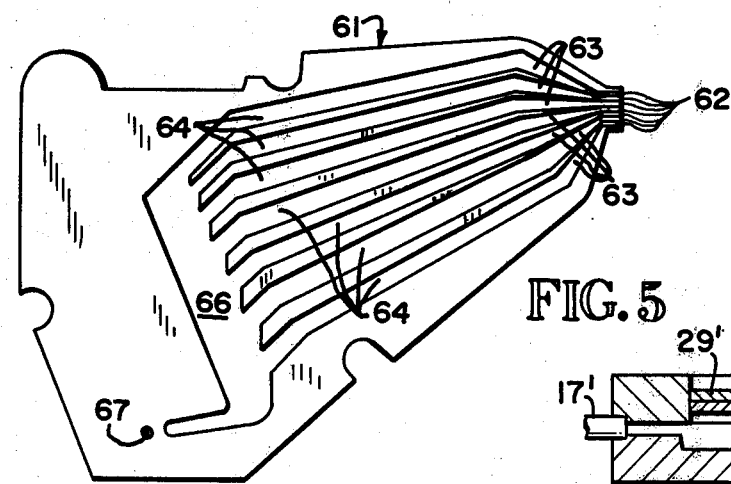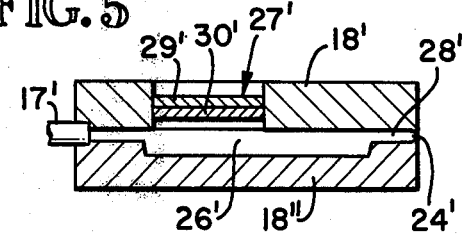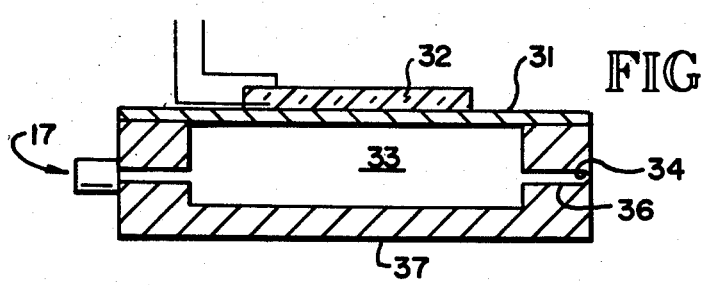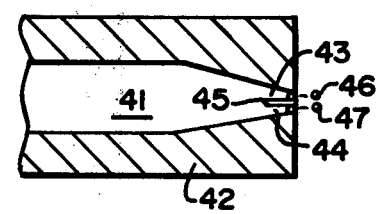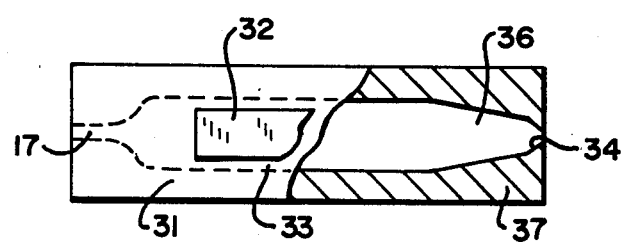

APPARATUS FOR RECORDING WITH WRITING FLUIDS AND DROP PROJECTION MEANS THEREFOR

CROSS-REFERENCE TO RELATED APPLICATIONS

This application is a continuation of co-pending application Ser. No. 815,502, filed on July 14, 1977, now abandoned, which in turn is a continuation of application Ser. No. 489,985, filed July 19, 1974, now U.S. Pat. No. 4,189,734, which in turn is a continuation-in-part of application Ser. No. 50,445 filed June 29, 1970, now U.S. Pat. No. 3,946,398.

BACKGROUND OF THE INVENTION

This invention relates generally to a non-impact printing apparatus and method and more particularly to an apparatus and method in which the printing fluid is ejected from a nozzle, by volume displacement.

Historically printing has been done by applying ink to a specially configured key or carrier and mechanically impacting the key or carrier on a recording medium such as paper to form an impression of the carrier. More recently, non-impact printing devices have been developed, where intelligence patterns (alphanumeric characters, graphical displays, etc.) are deposited on a recording medium. Non-impact printing devices utilize a variety of methods of forming the intelligence patterns, including chemically active and chemically inert processes, using either fluids or solids as the marking or printing medium, and requiring either specially treated recording media or untreated recording media.

It has been known to print by depositing discrete droplets of printing fluid on a recording medium in a predetermined pattern. Previous attempts to achieve such a method of printing utilize a continuous stream of fluid which separates into droplets which are charged and electrostatically deflected so that they form the desired pattern on the recording medium. Such methods produce acceptable resolution only when the charge per unit mass is accurately controlled for each droplet. Two basic variations have been developed; the droplets are either given equal charge per unit mass and then deflected by an electrostatic field whose intensity is controlled by the input signal, or the droplets are given a charge per unit mass according to the input signal and then deflected using a constant electrostatic field. Existing embodiments of both of these methods require that the fluid droplets be uniform, which has proven difficult to achieve. Once the stream of uniform droplets has been attained, it is usually necessary to provide voltages in the range of 2,000 to 10,000 volts for the electrostatic field. Such voltages are difficult and expensive to produce and control. Further, the process of charging the droplets themselves sometimes causes electrolysis of the printing fluid, producing corrosive by-products which may cause electrode deterioration.

In an effort to obtain droplets of uniform size, two basic methods have been developed in the prior art. First, the printing fluid is delivered to a nozzle at sufficient pressure to assure that a continuous jet of fluid issues from the nozzle. The jet stream is separated into droplets by using radial oscillations or vibrations induced in the nozzle itself by means of magnetostrictive drivers or piezoelectric crystals. The vibrations cause regularly spaced varicosities in the ink stream, aiding the natural tendency of the stream to separate into droplets, and making the ensuing droplets more uniform than would otherwise occur.

In another embodiment of the droplet formation process, the printing fluid is delivered to the nozzle under sufficient pressure to form a meniscus at the nozzle but not high enough to produce flow through the nozzle. In this method, the fluid is drawn from the nozzle electrostatically in a ray-like jet which is then deflected electrostatically as desired. The electrostatic field which draws the jet of fluid from the nozzle is constant, producing a continual stream of printing fluid. The stream breaks into a succession of droplets with essentially uniform mass and charge. A time-varying electrostatic field controlled by an input signal is then used to deflect the droplets as required for the formation of alphanumeric characters. The foregoing printing processes and mechanisms make use of a continuous flow of printing fluid, with the flow to be diverted to a reject basin or collector whenever no characters or patterns are to be printed. This results in a more complicated system for handling the flow of printing fluid than would otherwise be required.

In another type of device, piezoelectric transducers are employed to create shock waves in a horn-shaped nozzle. As the waves travel down along the nozzle from the large end to the small end, their intensity increases. The additive effect of high intensity shock waves at resonance serve to eject fluid from the end of the nozzle towards and onto an associated printing medium.

Other devices have been developed to expand and contract a crystal by electrical pulses tuned to a resonant frequency so that one droplet is ejected for each expansion or contraction of the crystals. However, these devices do not operate asynchronously. That is, a droplet is not produced only upon demand but rather continuously while operating at resonant frequency; thus any given droplet is dependent on previous pulses transmitted through the fluid.

Our prior application Ser. No. 50,445, filed June 29, 1970, now U.S. Pat. No. 3,946,398, is an asynchronous device of the same general character as the present device. In specific embodiments, however, the present invention shows an electromechanical transducer of a single electrically deformable plate, whereas the specific crystal in our prior application was a plate of two bonded crystals.

OBJECTS AND SUMMARY OF THE INVENTION

It is a general object of the present invention to provide an improved printing method and apparatus for recording with writing fluids and an improved drop projection means for use with such apparatus.

It is another object of the present invention to provide a drop projection means or head which asynchronously projects droplets having a controlled volume from a nozzle towards a printing medium responsive to electrical signals.

It is another object of the present invention to provide an improved method and apparatus for recording alphanumeric and graphical intelligence patterns on a recording medium by means of deposition of droplets of printing fluid on the recording medium in an economical and reliable manner.

It is a further object of the present invention to provide a drop projecting means which projects drops from a nozzle responsive to electrical signals and in which the volume of the drops is controlled by the applied electrical signals.

It is still a further object of the invention to provide a printing apparatus which is simple in construction; reliable in operation; capable of printing 1,000 characters per second; low in power requirements, cost and weight; and substantially noiseless compared to impact printers.

The foregoing and other objects are achieved by a drop projection means or head in which a nozzle communicates with a fluid chamber fed from an associated fluid reservoir. An electromechanical transducer is associated with one wall of said chamber to rapidly vary the volume of said chamber responsive to electrical pulse signals whereby a single fluid droplet having a volume dependent upon the electrical signal is ejected from the nozzle asynchronously as the signal demands.

Webster's Third New International Dictionary defines the word "synchronous" as: " . . . recurring or operating at exactly the same periods: marked by strict and exact coincidence in time, rate, or rhythm . . . ". As used in the present invention, the term "asynchronously" means lacking in a specific rate or rhythm. In the present case, there is no restriction on the rate (frequency) of droplet ejection, other than the recovery time needed to refill the nozzle. That is, droplets may be ejected in any desired manner, with or without a pattern, sequence or rhythm. The recovery time needed to refill the nozzle puts a practical maximum frequency of 50,000 droplets per second. It is essential to the printing of intelligible matter that the droplet ejection be asynchronous in view of the fact that the droplets follow a substantially straight trajectory to the printing medium and are not deflected.

The invention also relates to a printer employing a plurality of such printing heads to print various configurations, such as alphanumeric and graphical intelligence patterns, and to the method of printing such configurations.

BRIEF DESCRIPTION OF THE DRAWINGS

FIG. 1 is a schematic diagram, partially in cross-section, representing a recorder incorporating drop projecting means in accordance with the present invention.

FIG. 2 is a cross-sectional view of a printing head having an alternative configuration to that of FIG. 1.

FIG. 3 is a top view, partially in cross-section, of the printing head shown in FIG. 2.

FIG. 4 is a partial cross-section of an alternative embodiment of a nozzle configuration.

FIG. 5 is a plan view of a multi-chamber printing head.

FIG. 10 shows a variation of the particular print head construction of FIG. 1.

DESCRIPTION OF THE PREFERRED EMBODIMENT

Figure 6:
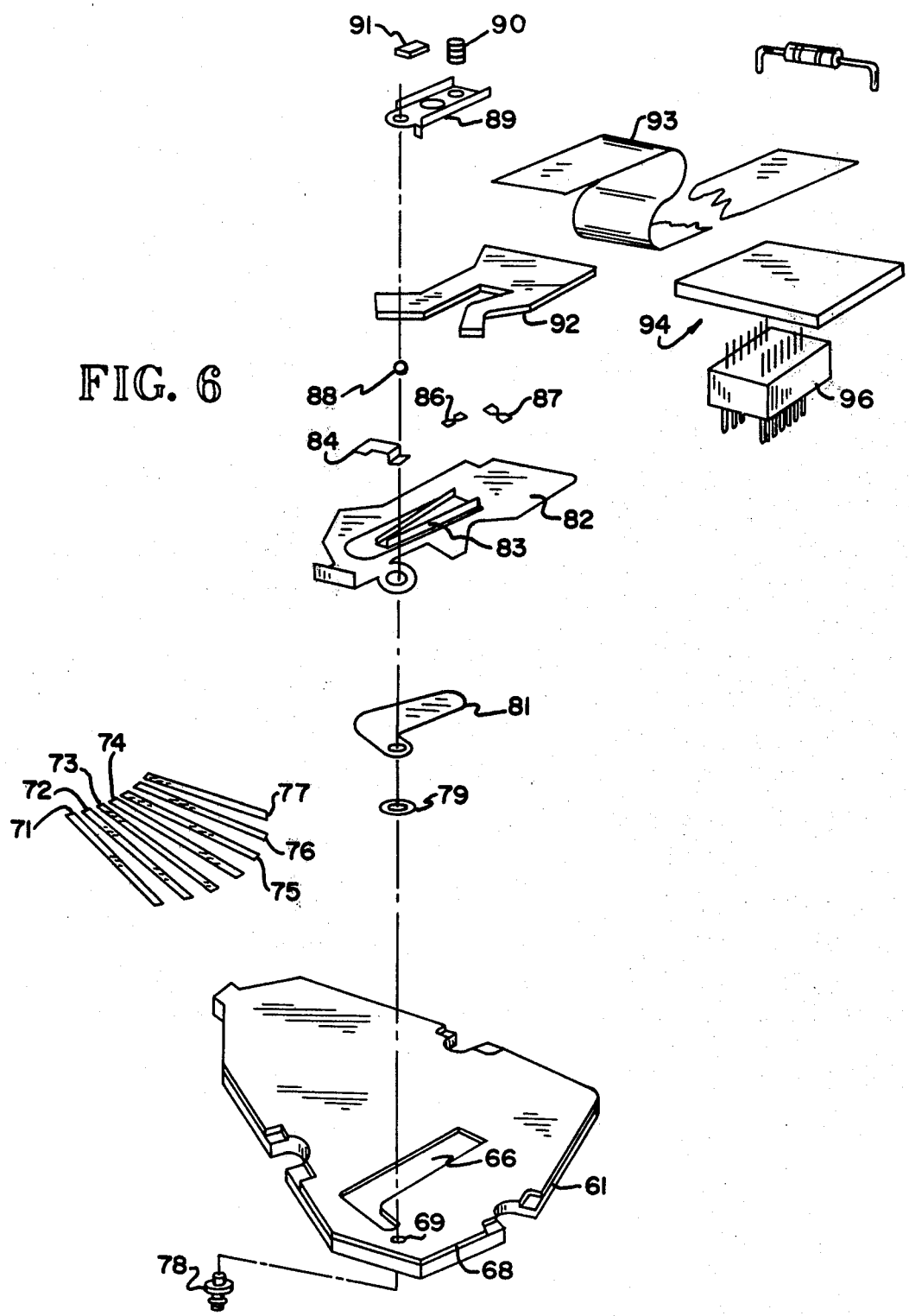
FIG. 6 is an exploded perspective view of the components in one embodiment of the ink jet printing head.

FIG. 1 is a schematic representation of an apparatus 11 adapted to record information on a recording medium 12. The recording medium 12 is shown as moving relative to apparatus 11 from supply roller 13 to take-up roller 14. However, it will be appreciated that relative movement between the apparatus 11 and the recording medium 12 may be in any suitable manner, with actual movement taking place either by the apparatus 11, the recording medium 12 or both.

Apparatus 11 includes an ink reservoir 16 which may be any suitable reservoir for the particular printing fluid used. Ink source 16 feeds through tube 17 to a drop projecting means on printing head 18. An electronic pulse generator 19 applies pulses to the printing head 18 through an appropriate transmission means 21, such as wires. Upon receiving a pulse from driver 19, printing head 18 discharges and projects a single discrete droplet 22 of printing fluid from orifice 24. Each electrical pulse generates a single droplet, independently of any previous signals, with the volume of the drop being controlled by the applied electrical pulse. In the embodiment shown in FIG. 1, the droplets form a line 23 on recording medium 12 as it is moved past the printing head 18. The driver 19 does not operate at a resonant frequency, rather it calls for a droplet according to the predetermined pattern to be printed.

For accurate recording of information on recording medium 12, a substantially straight trajectory is followed from orifice 24 on printing head 18 to recording medium 12. In this manner, careful positioning of the recording medium relative to apparatus 11, or vice versa, results in impingement of droplets in a predictable pattern according to signals generated by electronic driver 19, which is determined by the information to be printed. For the best recording of information, the droplet should be of a precise and predictable shape and volume. That is, each droplet must closely follow the electronic signals from driver 19 so that equally spaced uniform signals give equally spaced uniform droplets.

The droplet 22 is discharged from head 18 by the sudden reduction of volume in chamber 26. This sudden reduction in volume is accomplished by deflecting a plate 27 into the chamber 26 to displace sufficient ink to form a droplet 22. The deflection must be sudden enough to impart sufficient kinetic energy to the fluid in nozzle 28 to accelerate a portion of it beyond the escape velocity. Escape velocity is the minimum velocity which will cause a plug of ink extending from the nozzle to separate from the nozzle and form a free droplet.

The escape velocity can be determined by equating the kinetic energy of the droplet to the energy required to form the surface of the droplet:

$$\text{Escape Velocity} = \left[ \frac{12\sigma}{\rho D} \right]^{\frac{1}{2}}$$

where $\sigma$ is the surface tension constant of the fluid, $\rho$ is the density of the fluid, and D is the diameter of the droplet. As an example, the escape velocity of a droplet of water 0.015 centimeters in diameter is 167 centimeters per second.

In order to achieve this, the deflection plate must generate a pressure in the fluid capable of accelerating the fluid in the nozzle from rest to a velocity in excess of escape velocity by the time that the fluid has moved to extend a plug approximately one droplet diameter from the orifice. This minimum pressure is given by $$\text{Minimum Pressure} = 6K\sigma/D$$

where K is a dimensionless constant for the given geometry of the device and depends on the specific geometry and dimensions, $\sigma$ is the surface tension constant, and D is the droplet diameter. K usually is between 4 and 40. For a 0.015 cm water droplet, fired from a head with $K=10$, the minimum pressure is $2.8 \times 10^5$ Dynes/cm.$^2$, or approximately 4 pounds per square inch. The pressure plate must also displace an amount of fluid greater than the volume of the droplet to be ejected, since a portion of the fluid displaced by the pressure plate flows backward through the inlet.

The action of the pressure plate is such that as the plate returns to its rest position, a negative pressure pulse is generated that is approximately equal in magnitude to the positive pressure pulse. The negative pressure pulse reverses the direction of fluid flow in the nozzle, which assists the separation of the plug extending from the nozzle, generating a free droplet. The maximum pressure at which the head may be operated is determined by the onset of cavitation during the corresponding negative pressure pulse. The onset of cavitation is very difficult to express analytically, being dependent on frequency and viscosity, among other parameters. A practical upper limit for the print head pressure may be taken to be $3.5 \times 10^6$ Dynes per square centimeter, or approximately 50 pounds per square inch.

The inward deflection of plate 27 is shown in dotted lines in FIG. 1. A suitable plate that is capable of deflecting into the chamber 26 upon receiving an electrical signal from driver 19 is an assembly of two piezoelectric crystals 30 and 29 bonded together. Electrical connection 21 from driver 19 applies a voltage across the two faces of the plate so that the upper segment 29 contracts and the lower segment 30 expands so the entire plate 27 flexes inwardly into chamber 26. Plate 27 may be obtained commercially from Clevite Corporation, Cleveland, Ohio, under the trade name "Bimorph". The plate assembly is attached to head 18 in such a manner as to permit minute rotations at the edge of the assembly. Such attachment can be made using a wide variety of epoxy adhesives.

After a droplet has been ejected, the plate returns to its normal position and the meniscus of the liquid is drawn back in the orifice approximately one droplet diameter. This liquid must be replaced before the printer can be activated again to eject another droplet, and the capillary action of the fluid in the orifice provides the required force. Due to this replacement process, the maximum speed at which droplets can be ejected is approximately $$\text{Maximum Dot Frequency} = \left[ \frac{\sigma}{\rho K D^3} \right]^{\frac{1}{2}}$$

Again using the example of a 0.015 cm droplet of water ejected by a printer with geometry such that $K=10$, the maximum dot frequency is approximately 1440 drops per second for this example. For smaller droplet sizes, the maximum dot rate will increase, as will the maximum print rate in characters per second. If K is reduced to 4, then the maximum print rate would be about 1600 characters per second while printing with 0.0025 cm diameter dots. Dot rates as high as 50,000 drops per second may be achieved in this system, depending on the value of K, which in turn, depends on the geometry of the device. Where the droplet size is 10 times larger (0.025 cm), the maximum print rate decreases to 500 characters per second. While the maximum dot frequency in this example is as stated for best results, it is possible to operate at a faster rate even though complete replacement of fluid in the orifice has not taken place. In other words, still higher speeds may be attained even though each dot may not be perfect. Also momentum in the system during operation permits faster replacement of ink to the orifice.

A preferred embodiment of a single head that is better suited for multiple head arrays is shown in FIG. 2. FIG. 2 shows a cross-sectional view of a single print head, similar to FIG. 1. In FIG. 2, the deflection plate has two components: a cover slip 31, and a piezoelectric crystal 32 bonded to the cover slip. Upon application of voltage across the crystal, the crystal contracts, and the action of the contracting crystal 32 on the cover slip 31 causes the plate to deflect inward into chamber 33, reducing its volume sufficiently to eject a droplet from orifice 34 through nozzle 36. The cover slip operates in the nature of a diaphragm. Cover slip 31 is bonded to a base plate 37.

Since the crystal and cover slip must interact to provide the volume displacement and pressure necessary for droplet ejection, there are several explicit relationships that must be met for optimum functioning. It is desirable that the neutral axis (point of zero strain) of the crystal-cover slip assembly be at the interface between them. This condition is met provided that $$(Et^2)\ crystal = (Et^2)\ cover\ slip$$

where E is the modulus of elasticity and t is the thickness of the respective components. The diameter of each projected droplet should be between 1 and 3 times the average cross-sectional dimension of the orifice.

FIG. 3 is a plan view of the print head shown in FIG. 2. It will be seen that the crystal 32 is smaller in width than the pressure chamber 33, and this difference in dimensions is chosen to maximize the displacement attainable for a given width. We have found that the crystal should be approximately 70% as wide as the pressure chamber, and centered so as to equalize the gaps at both sides. The pressure chamber 33 and the crystal 32 are chosen in the form of a long rectangle. In this configuration, the width (smaller dimension of the rectangle) is chosen so as to provide the necessary pressure, and the length (larger dimension) is chosen so as to provide the necessary volume displacement. If the length exceeds 20 times the width, then the geometric factor K becomes undesirably large, which lowers the maximum dot frequency and raises the required minimum pressure. On the other hand, the length should be greater than twice the width to minimize the area of less than maximum deflection at the ends of the crystal. In volume each of the pressure chambers 33 should be between $1.6 \times 10^{-3}$ and $1.6 \times 10^{-2}$ cubic centimeters.

The diameter of orifice 34 is preferably small to enhance capillary actioned ink replacement, and to determine the size of the droplet. The nozzle 36 must be long enough to assure the drop follows a substantially straight trajectory parallel and coaxial with the orifice, but yet not excessively long, which would increase the geometric constant K, increase the pressure required, and decrease the maximum print rate. We have found that the nozzle length should be between 2 and 4 times the diameter of orifice 34.

We have found that the droplets upon impact with a printing surface produce printed spots two to four times the diameter of the droplet in flight. It then becomes obvious that the smaller the droplets, the more efficient the printing process becomes in terms of ink required to cover a given area. In addition, there is an increase in resolution, and an increase in the maximum print rate attainable when less ink is expelled in each droplet.

FIG. 4 shows an alternative preferred embodiment of a nozzle configuration, where two independent orifices 43 and 44 formed by a divider 45 are fed by a common pressure chamber 41 within base plate 42. With each pulse of the pressure plate (not shown), two droplets 46 and 47 are ejected simultaneously in exactly the same manner as a single droplet would be ejected from a single orifice.

FIG. 5 shows a cross-sectional view of a battery 61 of seven ink jet printers. Seven printers are compatible with commercially available character generators using a matrix of five dots wide and seven dots high. However, the system operates well using other dot matrices and a battery of between five and sixteen printers for the vertical component of the matrix. Each ink-jet printer contains the same elements which have been described in detail for single printers (FIG. 2). FIG. 5 shows the lower portion of a battery comprising a ceramic plate 61 having cavities etched into it to form the elements of the printer. Thus, plate 61 has seven nozzles 62, seven necks 63 and seven ink chambers 64. Over the ink chambers, on the upper portion of the battery (not shown, see FIG. 6), are seven crystals (not shown). Plate 61 also has etched therein a pulse trap chamber 66 communicating with each ink chamber opposite to the nozzles 62. The pulse trap chamber 66 serves, when filled with ink, to absorb back pressure of the ink. When the cover slip deflects into an ink chamber 64, a droplet is ejected from the corresponding nozzle 62, while at the same time ink is forced back toward pulse trap chamber 66. Thus, the volume displaced within ink chamber 64 must necessarily exceed the volume of ink ejected as a droplet.

Also shown in FIG. 5 is an opening 67 for connecting the ink source to a valve assembly presently to be described.

FIG. 6 is an exploded view of a system incorporating as an element the base plate 61 of the battery of seven nozzles shown in FIG. 5. In FIG. 6, base plate 61 has a cover slip 68 thereover and bonded to it to enclose the chambers, nozzles and necks described previously. Unlike plate 61 which has chambers etched in it, slip 68 has only two openings: a large one defining pulse trap chamber 66 and a valve opening 69. Each of the ceramic plates 61 and 68 may conveniently be made of "Photoceram", a trade name of Corning Glass Corp., Corning, N.Y. Overlying cover slip 68 and bonded thereto are seven piezoelectric crystals 71–77. On the under side of lower plate 61 is a tube fitting 78 which fits in opening 67 (FIG. 5). A tube (not shown) connects the ink source to fitting 78.

For manufacturing convenience, a series of seven nozzles in an array may be made with the nozzles between 0.005 and 0.025 centimeters in diameter. The distance between the first and last nozzles in the series should not exceed 0.25 centimeters in order to accommodate the usual print character size. Most typewriters, for example, have a character height of approximately 0.25 centimeters, and the present device approximates that size.

On top of the battery, at valve opening 69, a valve seal 79 is affixed. Overlying cover slip 68 at the two openings is a diaphragm 81. Diaphragm 81 is preferably made of a flexible material such as Saran plastic (Dow Chemical Co., Midland, Mich.). Diaphragm 81 forms the upper wall on pulse trap chamber 66. Overlying diaphragm 81 is a regulator frame 82, preferably made of steel. Frame 82 is conveniently made in an outline generally corresponding to that of diaphragm 81, since both cover chamber 66 as well as valve opening 69. Frame 82 has an opening punched out to accommodate opening 69 on plate 61 and another U-shaped cut to form a long tongue 83. Tongue 83 is formed by folding up the sides of the tongue to form a channel having a long moment arm. The movement of tongue 83 is limited by bar 84. At the base of tongue 83 are two strain gauges 86 and 87 one of which serves to measure the strain at the point at which tongue 83 is attached to the remainder of frame 82 and the second provides a control reference. The strain gauges are designed to sense the pressure within pulse trap chamber 66. As the ink flows into pulse trap chamber 66 under greater pressure, it raises the diaphragm 81 and tongue 83 lying thereover. As tongue 83 raises, it creates a greater strain on strain gauge 86 which, by comparison with control strain gauge 87 serves to electrically indicate the pressure within pulse trap chamber 66.

As strain gauge 87 exhibits strain corresponding to a change in pressure, it causes the opening of a gate valve in relation to the pressure being sensed. The gate valve regulates flow through opening 69. Plug 88 is secured to valve beam 89, diaphragm 81 and seal 79. When plug 88 is raised from opening 69, ink is permitted to flow out of opening 69 into pulse trap chamber 66 under diaphragm 81.

Figure 7:
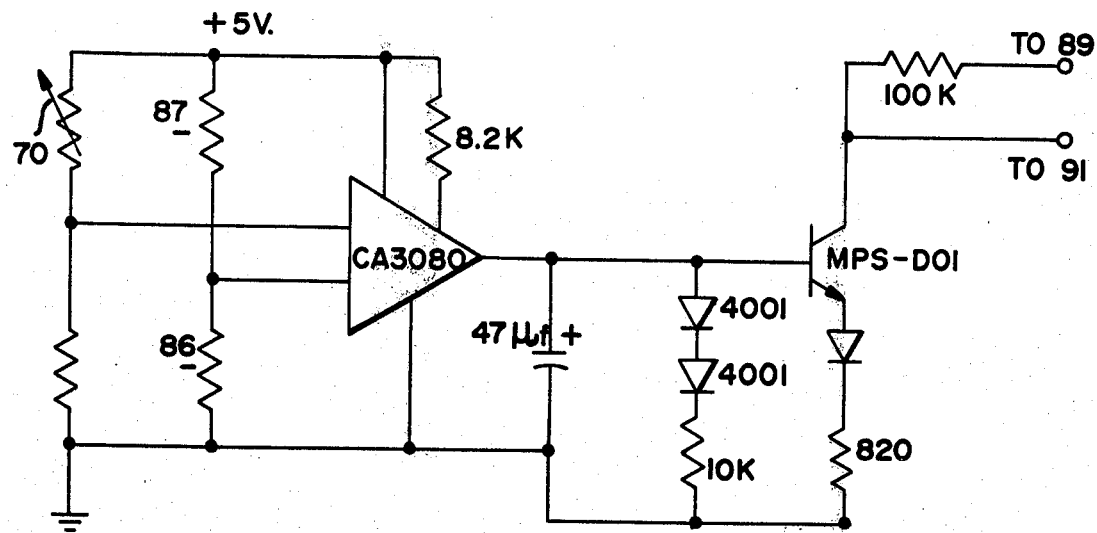
FIG. 7 is a circuit diagram of the ink control circuit.

The control plug 88 is governed by beam 89. Beam 89 is preferably a stainless steel reaction plate which is mounted on cover slip 68. Bonded to beam 89 is a piezoelectric crystal 91 which is electrically controlled by strain gauges 86 and 87 as shown in FIG. 7. As strain gauge 86 experiences a change in strain because of the raising or lowering of tongue 83, piezoelectric crystal 91 is caused to contract or expand in proportion to the strain being exhibited which action opens or closes the gate valve in a proportional manner. Set screw 90 serves to adjust beam 89 so that there is no flow of ink through opening 69 when there is no voltage applied to crystal 91.

Seven crystals 71–77 are each bonded over their respective chambers within plate 61 of the battery. The crystals 71–77 are electrically connected to a printed circuit board 92 by appropriate leads (not shown). Similarly, the leads from board 92 pass to strain gauges 86 and 87 as well as to piezoelectric crystal 91 in order to control the system. Printed circuit board 92 is fed by a fourteen conductor flat cable 93. Cable 93 is connected to a resistor printed circuit board 94, and then to a fourteen pin dip socket 96. The entire assembly illustrated in FIG. 6 forms one print head assembly having a battery of seven ink jet printers. To be compatible with commercially available character generators (5×7 dot array) and commonly accepted print sizes (each character 0.25 cm high), the seven individual orifices in the battery of printers must be spaced 0.036 cm apart. Of course, other type fonts can be accommodated by the printing method of this invention, and the number of nozzles and the size of the droplets can be changed within limits dictated by the various components. Nozzle spacings can be taken to be from 0.050 cm (the maximum practical dot size) to 0.012 cm (the minimum nozzle spacing compatible with fabrication techniques for the system shown in FIG. 6).

The crystals may be made of any suitable material capable of deforming upon electrical impulse. One suitable material is lead zirconate—lead titanate ceramics available commercially. Others include Rochelle salt, ammonium dihydrogen phosphate, lithium sulfate and barium titanate.

FIG. 7 is a circuit diagram for the pressure regulator circuit. Variable resistance 70 is the control which enables the system to be calibrated for the normal rest condition of pressure within the system as measured in pulse trap chamber 66 (FIG. 6). Ordinarily, we prefer a slight negative pressure within pulse trap chamber 66 in order to have an inwardly directed meniscus at each of the nozzles. However, any pressure is suitable so long as ink remains in the nozzle and does not drip from the nozzle. When resistance 70 is adjusted to the desired setting, strain gauge 86 measures strain caused by deflection of diaphragm 81. The output of the pressure regulator circuit shown in FIG. 7 is to piezoelectric crystal 91 which operates beam 89 to open and close valve seal 79.

Using a volume displacement means for an ink jet printer requires that the ink system be entirely free of air, and that no cavitation occur. Because of this, it is desirable to remove the gases dissolved in the ink that would be capable of coming out of solution during the negative pressure pulse. This can be accomplished by boiling the ink or by a process of vacuum de-airing. If such "de-aired" ink is exposed to atmospheric conditions, it will quickly reabsorb gases to regain its original equilibrium state. It is preferred to use a self-contained container and pressure-generating system that isolates the ink from the atmosphere.

Figure 8:
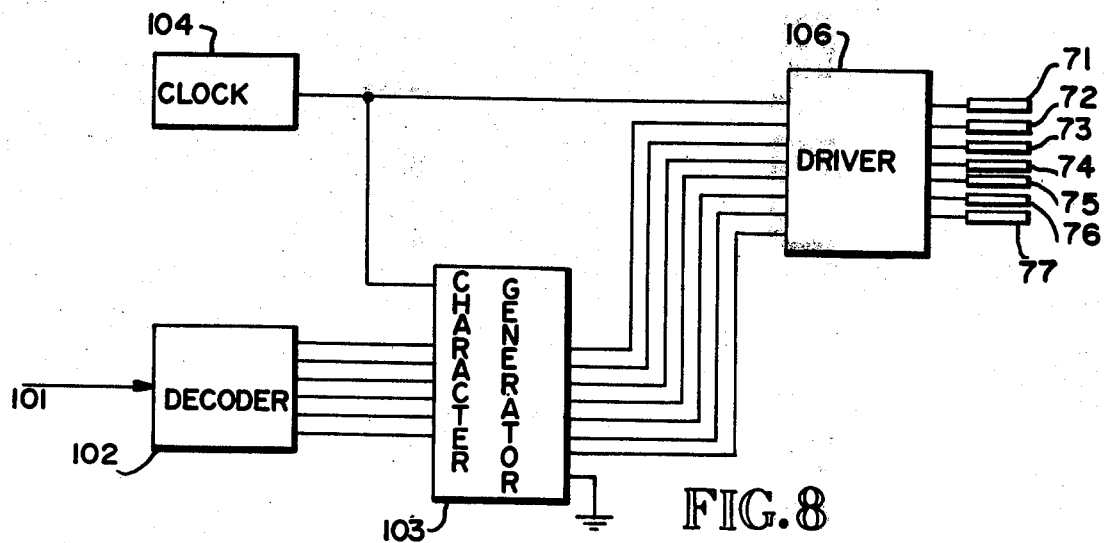
FIG. 8 is a schematic diagram of a system incorporating the ink jet printer of the present invention.

FIG. 8 is a schematic diagram for the control of the printers. A source 101 of alphanumeric characters is fed into a decoder 102. The source may be a key from a typewriter, a computer readout, or other source of alphanumeric characters. Decoder 102 provides the information required to define the specific alphanumeric character in a six bit code. A variety of commercially available decoders may be used. The six bits of information or address are fed to a character generator 103. Dot matrix character generators having 64 characters using five by seven bits are commercially available from many sources. The character generator also has fed into it a strobe pulse train from a clock 104. The pulse train also goes to driver circuit 106 as do the seven outputs of character generator 103. Driver 106 instructs the various crystals on how to fire for the printing of the desired dots to form alphanumeric characters. The seven outputs from driver circuit 106 go to crystals 71-77 overlying the ink chambers.

Figure 9:
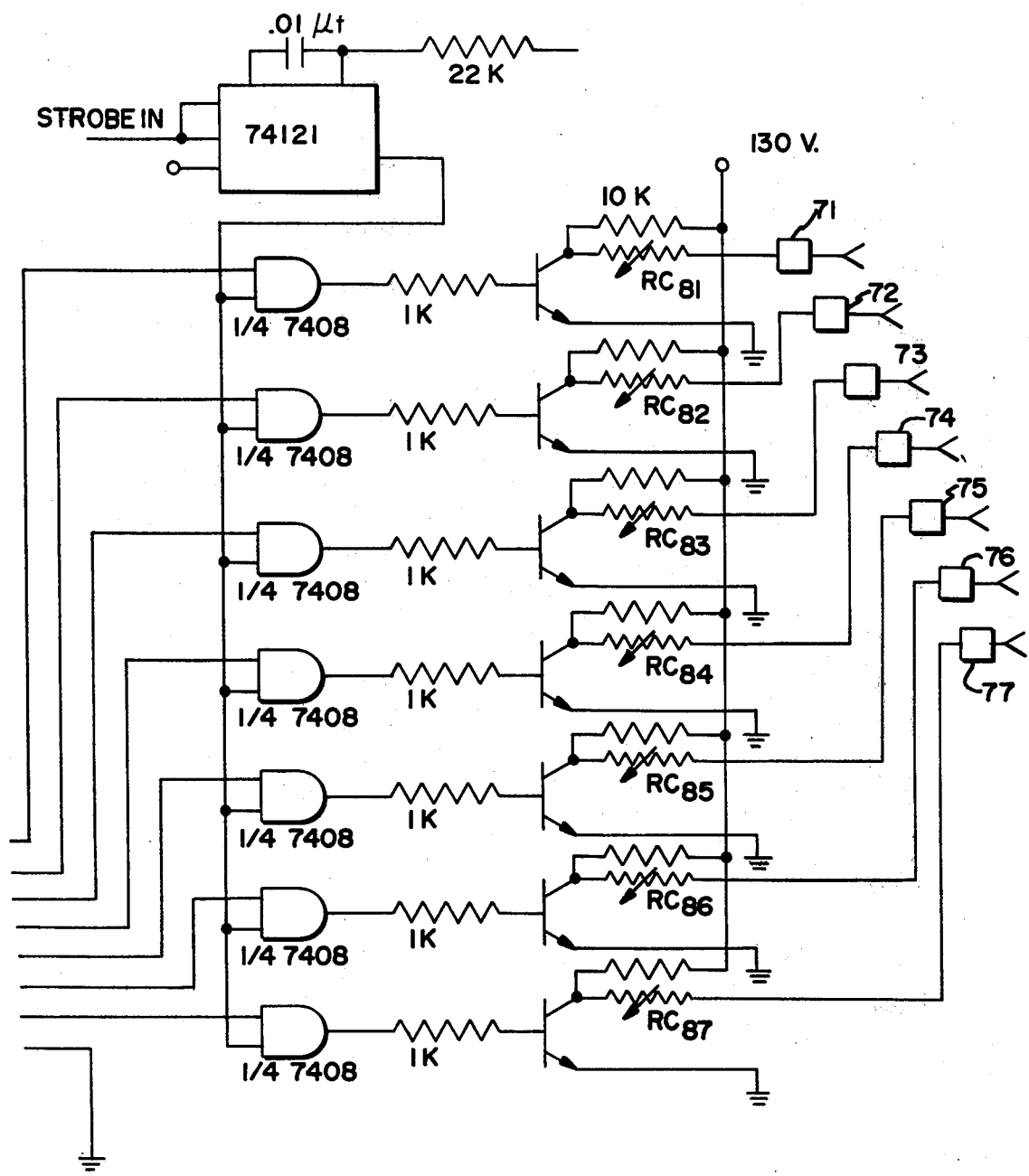
FIG. 9 is a circuit diagram for the driver circuit.

FIG. 9 illustrates the driver circuit for each of the crystals. The seven outputs from the character generator are connected to the driver circuit as illustrated in FIG. 8. The transistors shown in FIG. 9 are all suitable high voltage, low power transistors. The output of driver circuit 106 goes to crystals 71-77 as illustrated.

The size of the dot and the velocity at which it is ejected can be controlled electronically by various means, such as by varying the energy content of the driving pulse, or by changing the shape of the pulse while having the energy content essentially unchanged. The circuit illustrated in FIG. 9 has been designed to control dot size and velocity by means of changing the shape of the driving pulse, and more specifically by changing the rise time of the driving pulse, that is, the rate at which voltage is applied to the crystals. The crystals have an inherent capacitance due to their construction and geometry. Thus, when the 130 volt "source" voltage is applied, the circuit responds like an R-C circuit, with the resistance being the variable by which control is achieved. The variable "tuning" resistors are RC 81 to 87 respectively. The circuit shown in FIG. 9 is capable of controlling the ejection velocity of droplets from zero to maximum attainable with the source voltage supplied. The resistive elements 81 to 87 may be varied to give a time constant in the range between 5 microseconds and 100 microseconds. This is particularly advantageous for character printer applications, where the velocities of the seven droplets should be equal, while small volume or size variations are unimportant. The size of the dots can be controlled by changing the magnitude of the driving voltage supplied to the crystals. An increased drive voltage generates larger dots, and decreased drive yields smaller drops. In this manner, the darkness of the printed characters can be controlled. As an example, the size of the dot printed on paper from a nozzle with a diameter of 0.010 cm can be varied from approximately 0.010 cm to 0.060 cm.

In operation of the device, the information determining which character is to be printed comes from a source 101, is decoded into a six bit code which selects the correct five by seven matrix in a character generator. The driver circuit fires the appropriate crystal as the battery moves relative to the medium.

Each time a drive pulse is fired, ink volume within one or more of the confined chambers is reduced to suddenly expel a single droplet asynchronously towards the recording medium. This gives a recording system which is entirely on call, and does not fire during idle periods, either between characters when printing or when the printer is inactive. The desired dots can be formed or not as the printing head is stepped along relative to the recording medium. A stepper motor may conveniently be used to move the printing head to form each character in the X axis while dots can be formed in the Y axis by selectively causing specific drive crystals to be fired.

Using the device of the present invention a computer print-out, for example, can be produced at high speeds (up to 1000 characters per second) without the cost, noise and power requirements associated with impact printers currently in use. The device is light in weight and highly reliable.

Further developments in an ink supply system and attachment mechanisms for a print head occurring after the filing of the parent application Ser. No. 489,985 are described in co-pending application Ser. No. 694,064 filed June 7, 1976, having a common assignee with the present application, and incorporated herein by reference.

As is apparent from the foregoing description, the print head of FIG. 1 could also be constructed of two plates if it is desired to have a crystal structure that deflects into the ink chamber without deflecting the top plate thereinto. This is shown in FIG. 10 wherein elements that are functionally the same as those in FIG. 1 are given the same reference characters with a prime (') added. A top plate 18' has a hole therein in which a deflecting member 27' is installed. The deflecting member 27' preferably is formed of two bonded piezoelectric crystals 29' and 30' as discussed earlier with respect to FIG. 1.

A bottom plate 18" has etched in one surface thereof channels 26' and 28'. When the plates 18' and 18" are connected together as shown in FIG. 10, the bottom surface of the plate 18' forms the channel 26' into an ink chamber and the channel 28' into a nozzle that terminates in an orifice 24'. When the deflecting member 27' is appropriately energized, as discussed earlier with respect to FIG. 1, the volume of the chamber 26' is suddenly reduced, resulting in an ink droplet being discharged from the orifice 24'. Such multiple print heads can be formed in a single structure in a manner similar to that described with respect to FIG. 5.

Although the various aspects of the present invention have been described with respect to its preferred embodiments, it will be understood that the invention is entitled to protection within the full scope of the appended claims.

We claim:

1. A printing ink supply device for ink jet printers comprising:
   at least two plates located opposite to each other and interconnected,
   said first plate being provided with pumping means, said pumping means constituting a piezoelectric crystal and an operatively connected diaphragm,
   a pump chamber for said pumping means being constituted of a space formed between the pumping means and the second plate,
   a channel formed in said second plate by means of an elongated shallow groove in a surface facing said first plate together with an adjacent surface of said first plate,
   a capillary nozzle,
   said space communicating with said capillary nozzle by means of said channel.

2. A printing ink supply device as claimed in claim 1, wherein said channel is provided with an enlarged portion and a narrower portion, the latter portion being connected to said capillary nozzle.

3. A printing ink supply device for ink jet printers comprising:
   at least two plates located opposite to each other and interconnected,
   said first plate being provided with pumping means, said pumping means constituting a piezoelectric crystal and an operatively connected diaphragm,
   a pump chamber for said pumping means being constituted of a space formed between the pumping means and the second plate,
   a channel formed in said second plate by means of an elongated shallow groove in a surface facing said first plate together with an adjacent surface of said first plate,
   a capillary nozzle in one edge of said second plate,
   said space communicating with said capillary nozzle by means of said channel.

4. A printing ink device as claimed in claim 3, wherein said channel is provided with an enlarged portion and a narrower portion, the latter portion being connected to said capillary nozzle.

* * * * *